United States Patent

Kobayashi

(10) Patent No.: US 9,153,469 B2
(45) Date of Patent: Oct. 6, 2015

(54) CALCULATING APPARATUS, TRANSFER ROBOT SYSTEM, AND CALCULATING METHOD

(71) Applicant: DAIHEN Corporation, Osaka-shi, Osaka (JP)

(72) Inventor: Takumi Kobayashi, Osaka (JP)

(73) Assignee: DAIHEN CORPORATION, Osaka (JP)

( * ) Notice: Subject to any disclaimer, the term of this patent is extended or adjusted under 35 U.S.C. 154(b) by 125 days.

(21) Appl. No.: 14/031,735

(22) Filed: Sep. 19, 2013

(65) Prior Publication Data

US 2014/0081457 A1    Mar. 20, 2014

(30) Foreign Application Priority Data

Sep. 19, 2012   (JP) .................. 2012-205613

(51) Int. Cl.
  *G05B 19/04*   (2006.01)
  *G05B 19/18*   (2006.01)
  *H01L 21/68*   (2006.01)

(52) U.S. Cl.
  CPC .............. *H01L 21/68* (2013.01); *H01L 21/681* (2013.01)

(58) Field of Classification Search
  CPC combination set(s) only.
  See application file for complete search history.

(56) References Cited

U.S. PATENT DOCUMENTS

| | | | | |
|---|---|---|---|---|
| 5,740,059 A * | 4/1998 | Hirata et al. | ................ | 700/213 |
| 5,783,834 A * | 7/1998 | Shatas | ................ | 250/559.33 |
| 5,980,194 A * | 11/1999 | Freerks et al. | ................ | 414/754 |
| 5,981,966 A * | 11/1999 | Honma | ................ | 250/559.33 |
| 6,085,125 A * | 7/2000 | Genov | ................ | 700/218 |
| 6,126,381 A * | 10/2000 | Bacchi et al. | ................ | 414/754 |
| 6,242,879 B1 * | 6/2001 | Sagues et al. | ................ | 318/567 |
| 6,298,280 B1 * | 10/2001 | Bonora et al. | ................ | 700/218 |
| 6,522,942 B2 * | 2/2003 | Kondo et al. | ................ | 700/218 |
| 6,577,923 B1 * | 6/2003 | White et al. | ................ | 700/245 |
| 6,591,161 B2 * | 7/2003 | Yoo et al. | ................ | 700/218 |
| 6,763,281 B2 * | 7/2004 | Schauer et al. | ................ | 700/218 |
| 6,822,413 B2 * | 11/2004 | Simondet | ................ | 318/568.21 |
| 7,059,817 B2 * | 6/2006 | Sieradzki et al. | ................ | 414/217 |
| 7,230,702 B2 * | 6/2007 | Rice et al. | ................ | 356/400 |
| 7,342,643 B2 * | 3/2008 | Park et al. | ................ | 355/55 |
| 7,440,091 B2 * | 10/2008 | Bagley et al. | ................ | 356/237.2 |
| 7,848,832 B2 * | 12/2010 | Komiya et al. | ................ | 700/60 |
| 8,121,732 B2 * | 2/2012 | Hashimoto et al. | ................ | 700/260 |
| 8,335,589 B2 * | 12/2012 | Sarver et al. | ................ | 700/245 |
| 2006/0039781 A1 * | 2/2006 | Niewmierzycki et al. | .... | 414/217 |

FOREIGN PATENT DOCUMENTS

JP    2001-230303 A    8/2001

* cited by examiner

*Primary Examiner* — Bhavesh V Amin
(74) *Attorney, Agent, or Firm* — Troutman Sanders LLP

(57) ABSTRACT

A calculating apparatus includes an acquiring portion and a calculating portion. The acquiring portion acquires a center position of a wafer placed on an alignment apparatus, and a wafer angle corresponding to a marker such as an orientation flat. The calculating portion calculates by using the wafer center position and the wafer angle, a rotational angle of the wafer on the alignment apparatus, an approach angle, which is an angle of a direction in which a transfer robot approaches the wafer, and a distance between the wafer after the rotation and the transfer robot. Then, the alignment apparatus rotates the wafer by the rotational angle. The transfer robot turns by the approach angle. Subsequently, the transfer robot extends its arm according to the distance, thereby approaching the wafer, and retrieves the wafer.

4 Claims, 12 Drawing Sheets

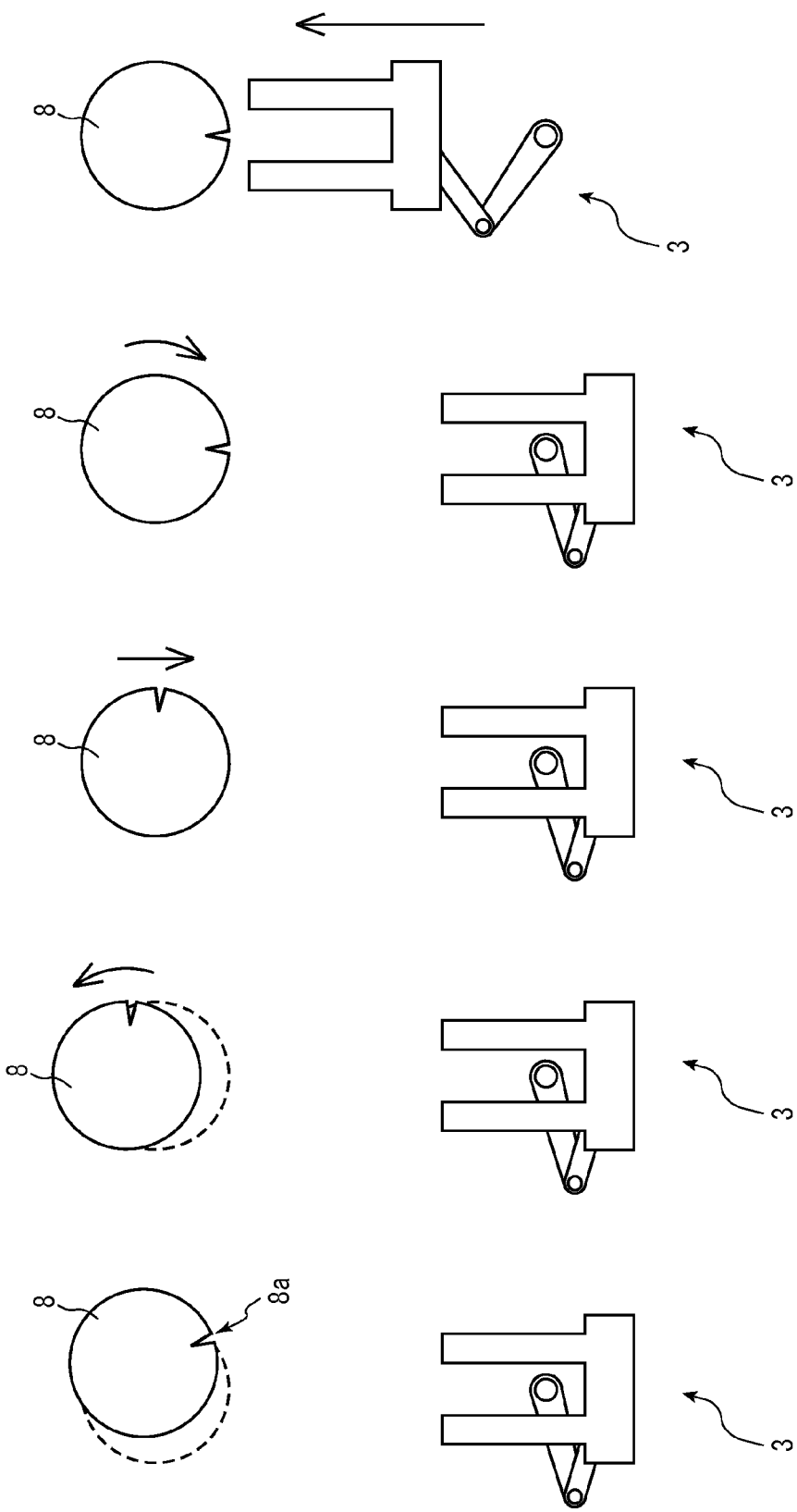

CALCULATING APPARATUS, TRANSFER ROBOT SYSTEM, AND CALCULATING METHOD

CROSS REFERENCE TO RELATED APPLICATION

This application claims priority under 35 U.S.C. §119 to Japanese Patent Application No. 2012-205613, filed on Sep. 19, 2012, the entire content of which being hereby incorporated herein by reference.

FIELD OF THE INVENTION

The present invention relates to a calculating apparatus and the like for calculating the rotational angle and the like of a wafer, in order to enable a transfer robot to retrieve the wafer at a predetermined position and a predetermined angle.

BACKGROUND

Conventionally, when transferring a wafer, the center position and the angle of the wafer are calculated in order to accurately set the position and the angle of the wafer. See JP 2001-230303A, for example. Furthermore, when calculating the position and the angle of that wafer, a marker such as an orientation flat or a notch provided on the circumferential edge of the wafer is often used. After the position and the angle of the wafer are calculated, an alignment apparatus accordingly adjusts the position and the angle of the wafer, so that a transfer robot can retrieve the wafer at a predetermined position and a predetermined angle.

FIGS. 8A to 8E are views showing an exemplary conventional alignment method. In this alignment method, an alignment apparatus performs alignment by rotating a wafer 8 and moving the wafer 8 in the upper-lower direction of the drawings, which corresponds to the approach direction of a transfer robot 3. Furthermore, in FIGS. 8A and 8B, each of circles indicated by the broken lines shows the predetermined position of the wafer 8 that the transfer robot 3 approaches. Hereinafter, that position may be referred to as a "regular position". It is assumed that the center of the circle indicated by the broken line is a rotational center of the wafer 8 on the alignment apparatus. Furthermore, the predetermined angle of the wafer 8 that the transfer robot 3 approaches may be referred to as a "regular angle". That is to say, when the transfer robot 3 retrieves the wafer 8, that wafer 8 has to be placed at the regular position and the regular angle on the alignment apparatus.

FIG. 8A is a view showing an initial position of the wafer 8 placed on the alignment apparatus. At that initial position, for example, the method of JP 2001-230303A or the like is used to calculate the center position and the angle of the wafer 8. Then, as shown in FIG. 8B, the alignment apparatus rotates the wafer 8 using the center position and the like of the wafer 8, thereby eliminating a displacement between the current position and the regular position of the wafer 8 in a direction that is orthogonal to the movement direction of the wafer 8. Next, as shown in FIG. 8C, the alignment apparatus moves the wafer 8 in the movement direction, thereby setting the wafer 8 at the regular position. Furthermore, as shown in FIG. 8D, the alignment apparatus rotates the wafer 8, thereby setting the wafer 8 at the regular angle. Subsequently, as shown in FIG. 8E, the transfer robot 3 extends its arm by a predetermined length, thereby approaching the wafer 8 that has been set at the regular position and the regular angle. As a result, the transfer robot 3 can retrieve the wafer 8 at the predetermined position and the predetermined angle.

However, according to the conventional alignment method, the alignment apparatus performs operations multiple times, i.e., rotating, moving, and further rotating the wafer 8, and, thus, this method is problematic in that the time necessary for the alignment is long.

The present invention was arrived at in order to solve the above-described problem, and it is an aspect thereof to provide an apparatus and the like capable of shortening the time necessary for the alignment.

SUMMARY

In order to achieve the above-described aspect, the present invention is directed to a calculating apparatus, including an acquiring portion that acquires a wafer center position, which is a center position of a wafer placed on an alignment apparatus and having a marker for angle acquisition, and a wafer angle, which is an angle corresponding to the marker, and a calculating portion that calculates a rotational angle by which the wafer is to be rotated by the alignment apparatus, an approach angle, which is an angle of a direction in which a transfer robot for transferring the wafer is to approach the wafer, and a distance between the wafer after rotation according to the rotational angle and the transfer robot by using the wafer center position and the wafer angle, wherein the transfer robot can retrieve the wafer at a predetermined position and a predetermined angle from the alignment apparatus, by approaching the wafer after rotation in the direction corresponding to the approach angle and according to the distance.

With this configuration, the wafer is rotated according to the calculated rotational angle, and the transfer robot approaches the wafer after the rotation, in a direction corresponding to the calculated approach angle, according to the calculated distance, so that the transfer robot can retrieve the wafer at a predetermined position and a predetermined angle. In this manner, the wafer does not have to be repeatedly rotated for alignment, and the wafer does not have to be moved, so that the time necessary for the wafer alignment can be shortened.

Furthermore, the calculating apparatus according to the present invention may be configured such that the acquiring portion includes an image capturing unit that captures an image of the wafer placed on the alignment apparatus, and an acquiring unit that acquires the wafer center position and the wafer angle of the wafer by using an image of the wafer captured by the image capturing unit.

With this configuration, for example, if the image capturing unit can capture an image of the entire wafer, the wafer does not have to be rotated in order to acquire the wafer center position and the wafer angle, so that the wafer center position and the like can be acquired in a short time.

Furthermore, the calculating apparatus according to the present invention may be configured such that the acquiring portion has two or more image capturing units that capture images of different areas of the wafer placed on the alignment apparatus, and the acquiring unit acquires the wafer center position and the wafer angle by using at least one image including the marker among two or more images of the wafer captured by the two or more image capturing units.

With this configuration, the distance in the height direction between the image capturing units and the wafer can be shortened compared with the case in which a single image capturing unit is used. As a result, the apparatus size can be reduced, and the precision can be improved.

Furthermore, the calculating apparatus according to the present invention may be configured such that the image capturing unit has an optical axis that is not along the normal direction of the wafer.

With this configuration, the distance in the height direction between the image capturing unit and the wafer can be shortened compared with the case in which an image is captured in the normal direction of the wafer. As a result, the apparatus size can be reduced.

Moreover, the present invention is directed to a transfer robot system that includes a calculating apparatus, an alignment apparatus and a transfer robot. The calculating apparatus includes an acquiring portion that acquires a wafer center position, which is a center position of a wafer placed on the alignment apparatus and having a marker for angle acquisition, and a wafer angle, which is an angle corresponding to the marker. The calculating apparatus also includes a calculating portion that calculates a rotational angle by which the wafer is to be rotated by the alignment apparatus, an approach angle, which is an angle of a direction in which the transfer robot for transferring the wafer is to approach the wafer, and a distance between the wafer after rotation according to the rotational angle and the transfer robot by using the wafer center position and the wafer angle. The transfer robot can retrieve the wafer at a predetermined position and a predetermined angle from the alignment apparatus, by approaching the wafer after rotation in the direction corresponding to the approach angle and according to the distance. The alignment apparatus rotates the wafer according to the rotational angle calculated by the calculating apparatus. The transfer robot approaches the wafer after rotation in a direction corresponding to the approach angle calculated by the calculating apparatus and according to the distance calculated by the calculating apparatus.

With this configuration, the alignment can be performed in a short time.

The calculating apparatus and the like according to the present invention can calculate the rotational angle, the approach angle, and the like for performing alignment in a short time, so that the time necessary for the alignment can be shortened.

BRIEF DESCRIPTION OF THE DRAWINGS

FIGS. 8A, 8B, 8C, 8D and 8E are views illustrating an exemplary conventional alignment method.

DETAILED DESCRIPTION

Figure 1:
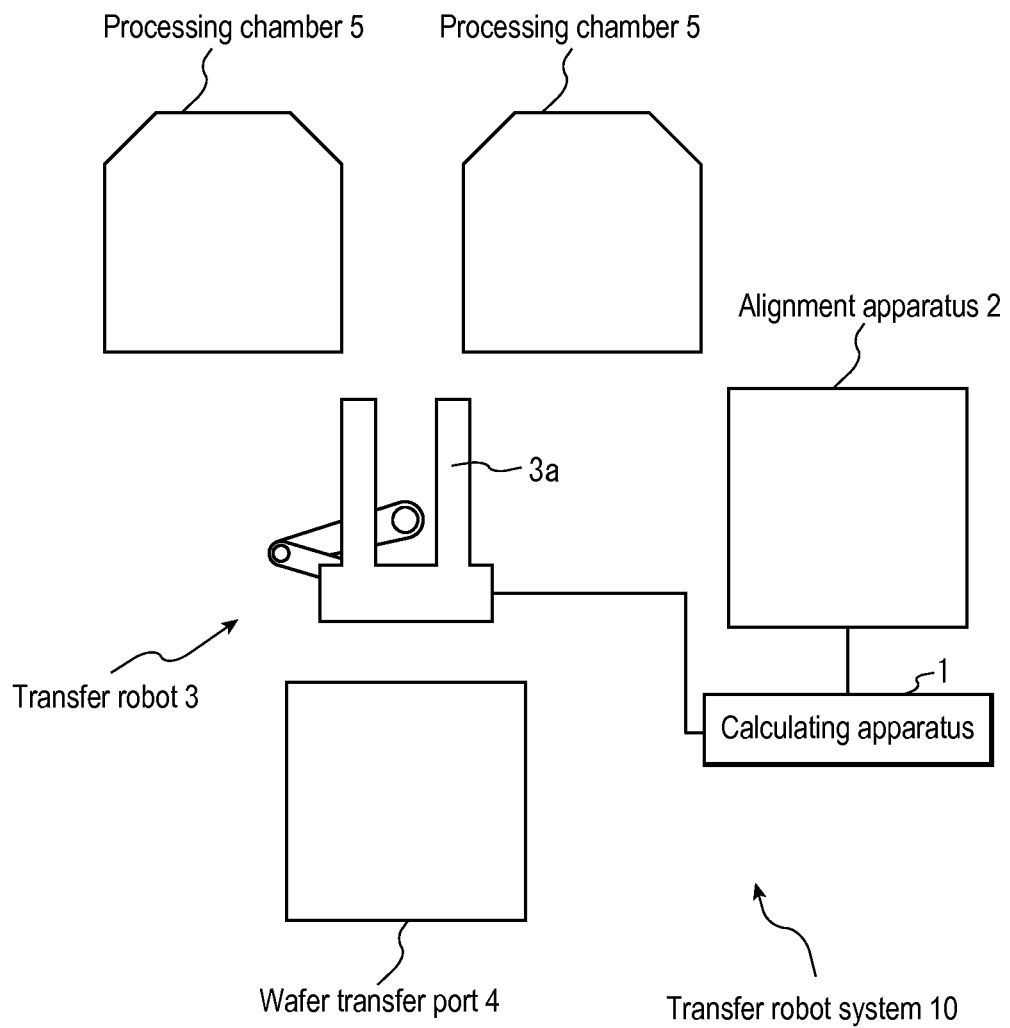
FIG. 1 is a view showing the configuration of a transfer robot system according to an example of the present invention.

Hereinafter, a transfer robot system according to the present invention will be described by way of an example. Note that constituent elements and steps denoted by the same reference numerals are the same as or correspond to each other in the following example, and, thus, a description thereof may not be repeated.

The description below is about a transfer robot system according to the example of the present invention with reference to the drawings. The transfer robot system according to this example can realize alignment in a short time, by calculating the rotational angle of a wafer, the approach angle to the wafer, and the like, and rotating the wafer and changing the approach direction to the wafer according to the calculated angles and the like.

FIG. 1 is a view showing the configuration of a transfer robot system 10 according to this example. The transfer robot system 10 according to this example includes a calculating apparatus 1, an alignment apparatus 2, and a transfer robot 3. The calculating apparatus 1 calculates a rotational angle of a wafer, an approach angle, which is an angle of a direction in which the transfer robot 3 approaches the wafer, and a distance between the wafer after rotation according to the rotational angle and the transfer robot 3. The alignment apparatus 2 is an apparatus for performing alignment of a wafer. The transfer robot 3 is an apparatus for transferring a wafer, and transfers a wafer, for example, between the alignment apparatus 2, a wafer transfer port 4, and processing chambers 5. The transfer robot 3 is typically a selective compliance assembly robot arm (SCARA) robot. Note that, although FIG. 1 shows only a manipulator, the transfer robot 3 may have, for example, a control portion and a servo controller (not shown) for controlling the manipulator. Furthermore, there is no limitation on the number of axes of the transfer robot 3.

Figure 2:
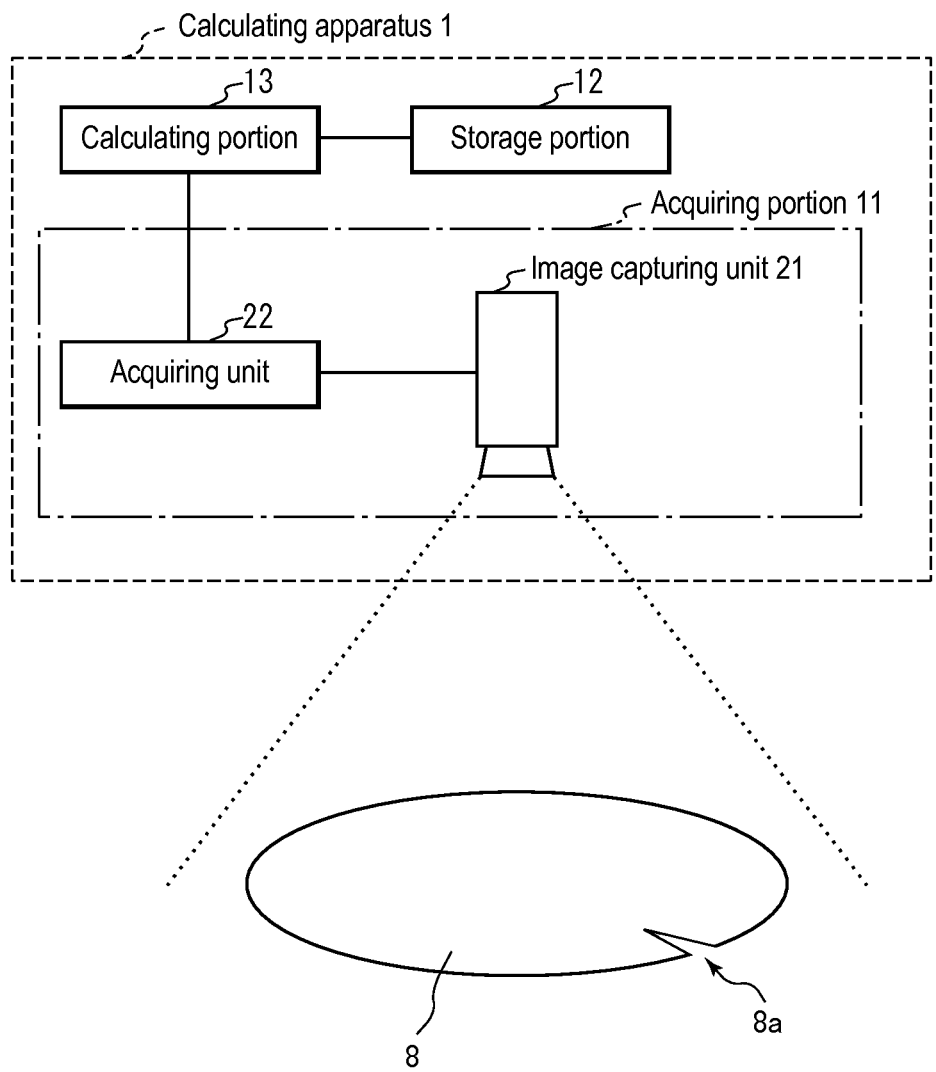
FIG. 2 is a block diagram showing the configuration of a calculating apparatus according to this example.

FIG. 2 is a block diagram showing the configuration of the calculating apparatus 1 according to this example. The calculating apparatus 1 according to this example includes an acquiring portion 11, a storage portion 12, and a calculating portion 13.

The acquiring portion 11 acquires a wafer center position, which is a center position of a wafer 8 placed on the alignment apparatus 2. The wafer 8 has a marker 8a for enabling the acquiring portion 11 to acquire the angle of the wafer 8. The marker 8a may be, for example, a notch shown in FIG. 2 or an orientation flat, or may be other markers using color, projection, recess, mark, or the like. The acquiring portion 11 acquires a wafer angle, which is an angle corresponding to the marker 8a of the wafer 8. In this manner, the marker 8a is used to acquire the angle of the wafer 8, and, thus, it is preferably provided at the circumferential edge of the wafer 8. Note that the wafer center position may be coordinate values using a given point as a reference. This reference point may be, for example, the rotational center on the alignment apparatus 2. Furthermore, the wafer angle may be an angle using a given direction as a reference. This reference direction may be, for example, an approach direction in which the transfer robot 3 approaches the wafer 8 concentrically placed on the rotational center on the alignment apparatus 2. Note that there is no limitation on the method of the acquiring portion 11 for acquiring the wafer center position and the wafer angle. For example, the acquiring portion 11 may acquire the wafer center position and the like (1) by capturing an image of the wafer 8, (2) by detecting the edge position of the wafer 8, or using other methods. Hereinafter, the cases in which the acquiring portion 11 acquires the wafer center position and the like using the methods (1) and (2) will be described.

(1) Acquiring the Wafer Center Position and the like by Capturing an Image

In this case, as shown in FIG. 2, the acquiring portion 11 includes an image capturing unit 21 and an acquiring unit 22. The image capturing unit 21 captures an image of a wafer placed on the alignment apparatus 2. The area of the image of the wafer 8 captured by the image capturing unit 21 may be, for example, the entire wafer 8 or part of the wafer 8. If the image capturing unit 21 captures an image of part of the wafer 8, it is preferable for the image capturing unit 21 to capture an image of an area including the circumferential edge of the wafer 8, because the center position of the wafer 8 can be acquired. Furthermore, if the image capturing unit 21 captures an image of part of the wafer 8, it is preferable to perform the image capturing multiple times while rotating the wafer 8 so as to capture an image of an area including the marker 8a of the wafer 8, because the wafer angle can be acquired. The rotation is performed by the alignment apparatus 2.

Figure 3A:
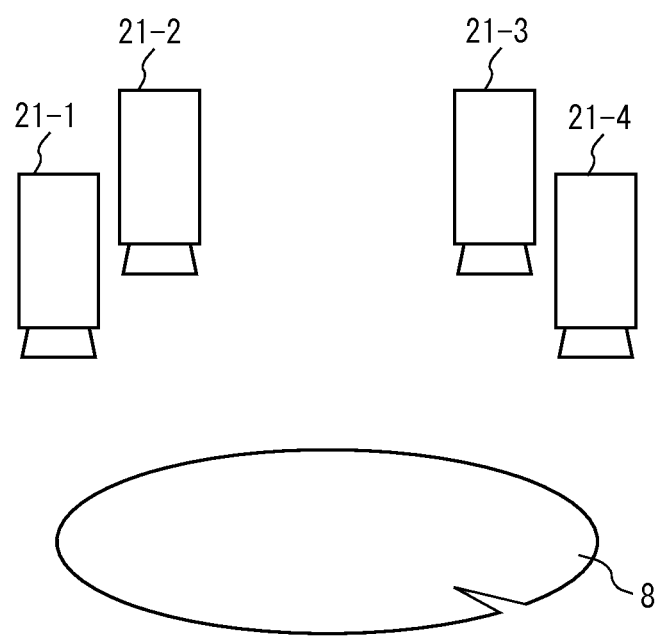
FIG. 3A is a view showing multiple image capturing units in this example.
Figure 3B:
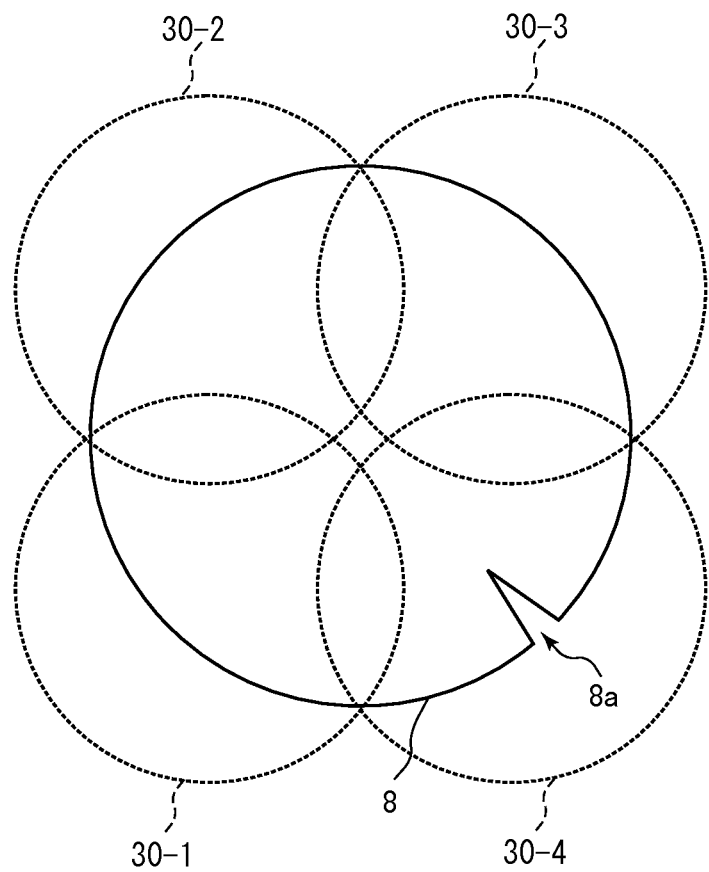
FIG. 3B is a view showing multiple image capturing areas of the multiple image capturing units in this example.

Note that there is no limitation on the number of image capturing units 21 for capturing an image of the wafer 8. For example, an image of the wafer 8 may be captured by one image capturing unit 21 as shown in FIG. 2, images of mutually different areas of the wafer 8 placed on the alignment apparatus 2 may be captured by four image capturing units 21-1 to 21-4 as shown in FIG. 3A, or images of mutually different areas of the wafer 8 may be captured by any other number of image capturing units. The phrase "mutually different areas of the wafer 8" refers to areas that are not totally the same, and these areas may or may not have portions that overlap each other. If multiple image capturing units capture an image of the wafer 8, each image capturing unit preferably captures an image of the circumferential edge of the wafer 8. For example, if the image capturing units 21-1 to 21-4 perform the image capturing, the image capturing units 21-1 to 21-4 may respectively capture images of image capturing areas 30-1 to 30-4 shown in FIG. 3B. Note that even if multiple image capturing units perform the image capturing, the entire circumferential edge of the wafer 8 may or may not be covered by multiple captured images obtained by the image capturing. In the latter case, it is preferable to perform the image capturing multiple times while rotating the wafer 8 such that an area including the marker 8a is contained in any one of the captured images. Note that if the multiple image capturing units 21-1 to 21-4 are used to perform the image capturing as shown in FIG. 3A, the distance in the normal direction of the wafer 8 between the image capturing units 21-1 to 21-4 and the wafer 8 can be made shorter, so that the apparatus size can be reduced. Furthermore, in the case of using the multiple image capturing units 21-1 to 21-4, the captured images have an area larger than that obtained using a single image capturing unit 21, so that the precision in the wafer center position and the like can be improved. It is assumed that the multiple image capturing units 21-1 to 21-4 and the image capturing unit 21 have substantially the same angle of view and the same number of pixels. Furthermore, although the image capturing areas are circular in FIG. 3B, but they may be rectangular.

Figure 3C:
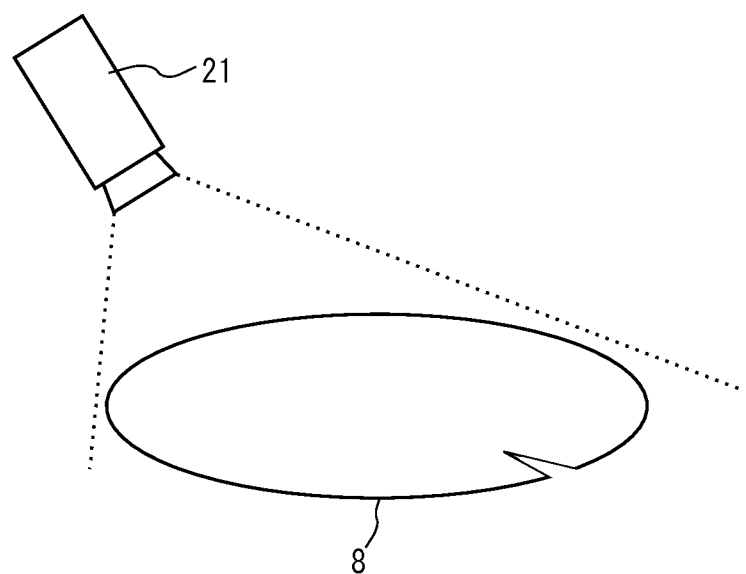
FIG. 3C is a view illustrating image capturing at an angle in this example.

Furthermore, there is no limitation on the direction in which the image capturing unit 21 captures an image of the wafer 8. For example, the optical axis of the image capturing unit 21 may be along the normal direction of the wafer 8 whose image is to be captured as shown in FIG. 2, or may not be along the normal direction as shown in FIG. 3C. In the former case, the rotational axis about which the alignment apparatus 2 rotates the wafer 8 is preferably coaxial with the optical axis of the image capturing unit 21, but there is no limitation to this. If the image capturing unit 21 has an optical axis that is along the normal direction of the wafer 8, the shape of the wafer 8 in a captured image is substantially circular. On the other hand, if the image capturing unit 21 has an optical axis that is not along the normal direction of the wafer 8 as shown in FIG. 3C, the shape of the wafer 8 in a captured image is substantially elliptical, whereas the distance in the normal direction of the wafer 8 between the image capturing unit 21 and the wafer 8 can be made shorter, so that the apparatus size can be reduced. Note that also in the case of capturing an image of the wafer 8 at an angle, multiple image capturing units may be used to perform the image capturing.

Incidentally, the image capturing unit 21 can be realized, for example, as an image sensor such as a CCD or a CMOS. Furthermore, the image capturing unit 21 may have an optical system with which an image of light from an image capturing area can be formed on a light-receiving face of the image sensor. Furthermore, there is no limitation on the data format and the like of the captured images.

The acquiring unit 22 acquires the wafer center position and the wafer angle of the wafer 8, using the image of the wafer 8 captured by the image capturing unit 21 or the like. The acquiring unit 22 can specify the wafer center position, for example, by specifying the contour of the wafer 8 in the captured image using contour extraction or the like, and specifying the center point of a circle or an arc, which is the specified contour. Note that the wafer center position may be specified as a position in a predetermined coordinate system. For example, the coordinate system may be an orthogonal coordinate system in which the rotational center on the alignment apparatus 2 is taken as an origin, the approach direction in which the transfer robot 3 approaches the wafer 8 placed at the regular position is taken as a Y axis, and the direction that is orthogonal to the Y axis is taken as an X axis, or may be other coordinate systems. In this example, the former case will be described. That is to say, it is assumed that, in FIG. 1, the Y axis is set rightward, and the X axis is set downward. Note that, in order to acquire the wafer center position as the coordinate values in the XY orthogonal coordinate system, the acquiring unit 22 may acquire the wafer center position in the XY orthogonal coordinate system, for example, by first specifying the coordinates of the wafer center position in a captured image, and converting them into the coordinates of the wafer center position in the XY orthogonal coordinate system. Furthermore, the acquiring unit 22 may specify the wafer angle, for example, by specifying the position of the marker 8a of the wafer 8 in a captured image, and specifying a straight line connecting the position of the marker 8a and the wafer center position. The wafer angle may be, for example, the angle between a predetermined direction and the straight line connecting the position of the marker 8a and the wafer center position. The predetermined direction may be, for example, the X-axis direction or the Y-axis direction in the XY orthogonal coordinate system, or may be other directions. In this example, the case will be mainly described in which the predetermined direction is the Y-axis direction in the XY coordinate system. For example, the acquiring unit 22 may specify the position of a notch, an orientation flat, or the like, provided as the marker 8a, by specifying a position on the specified contour of the wafer 8 closest to the wafer center position, may specify the position of the marker 8a using pattern matching, may specify the position of a notch, an orientation flat, or the like, provided as the marker 8a, by detecting a discontinuous change in the tangent direction of the specified contour of the wafer 8, or may specify the position of the marker 8a using other methods. Furthermore, the acquiring unit 22 may acquire the wafer angle in a captured image, or may acquire the wafer angle in a predetermined coordinate system such as an XY orthogonal coordinate system.

Figure 3D:
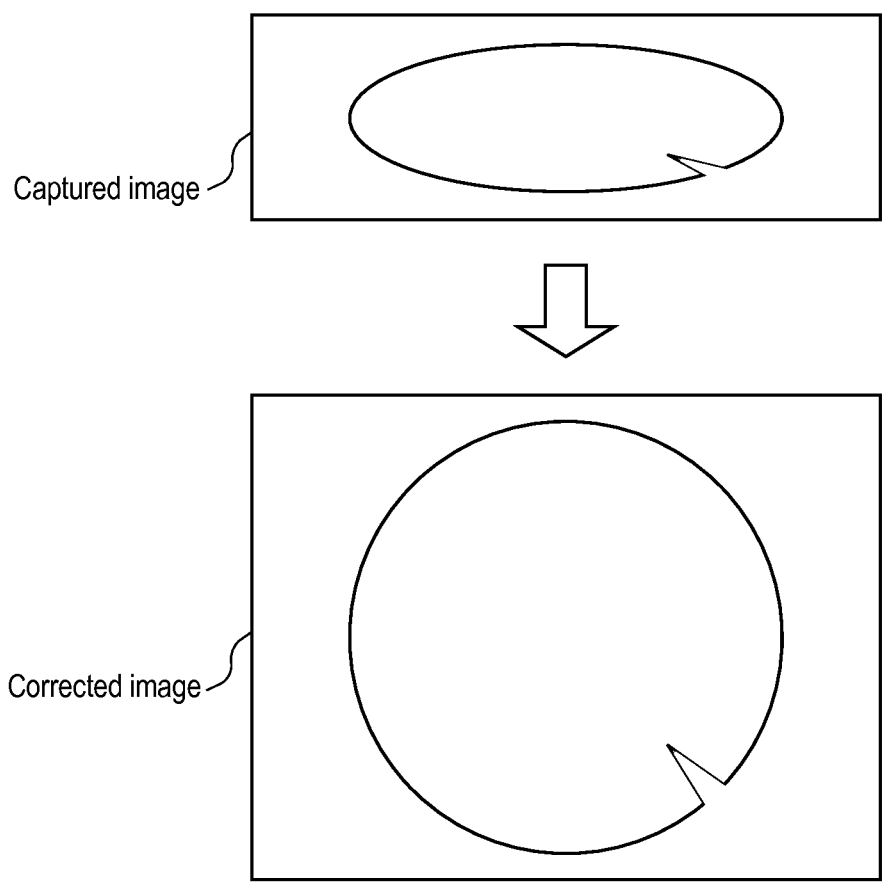
FIG. 3D is a view illustrating correction of a captured image in this example.

Note that if the image capturing unit 21 or the like captures an image of the wafer 8 at an angle, the acquiring unit 22 may generate a corrected image in which a captured image is corrected such that the contour of the wafer 8 becomes circular as shown in FIG. 3D, and acquire the wafer center position and the like as described above using the corrected image, or may acquire the wafer center position and the like using the captured image itself.

Furthermore, if multiple image capturing units 21 are used to perform the image capturing, the acquiring unit 22 may acquire the wafer center position and the wafer angle using at least an image including the marker 8a among multiple images of the wafer 8 captured by the multiple image capturing units 21. That is to say, the acquiring unit 22 may calculate the wafer center position and the like using only an image including the marker 8a, or may calculate the wafer center position and the like using other images as well. In the latter case, for example, wafer center positions may be calculated using multiple images, and an average thereof may be taken as a final wafer center position. Furthermore, in the case of acquiring multiple images while rotating the wafer 8, the acquiring portion 11 may give the alignment apparatus 2 an instruction to rotate the wafer 8 as appropriate.

(2) Acquiring the Wafer Center Position and the like using Edge Position

In this case, contrary to the configuration in FIG. 2, the acquiring portion 11 may include an edge position detector (not shown), and a calculating unit (not shown) that calculates the wafer center position and the wafer angle using the edge position of the wafer 8 detected by the edge position detector. The edge position detector may, for example, detect the edge position of the wafer 8 at a certain location. Then, the alignment apparatus 2 may rotate the wafer 8 placed thereon, thereby allowing the edge position detector to detect the edge position at the entire or part of the circumference of the wafer 8. Note that, in the case of detecting the edge position at part of the circumference of the wafer 8, it is preferable that the detected edge position includes the position of the marker 8a. Furthermore, it is preferable that the wafer center position can be acquired within the range where the edge position is detected. A method for calculating the wafer center position and the like using the edge position is described, for example, in JP 2001-230303A, and, thus, a detailed description thereof has been omitted.

In the storage portion 12, information used by the calculating portion 13 for calculating the rotational angle and the like is stored. Specifically, in the storage portion 12, the distance between the wafer 8 placed at the regular position and the transfer robot 3, and the angle from the reference direction to the wafer 8 placed at the regular angle may be stored. This angle may be, for example, the angle between the Y axis and the line segment from the center position to the marker 8a of the wafer at the regular position and the regular angle.

There is no limitation on the procedure in which the information is stored in the storage portion 12. For example, the information may be stored in the storage portion 12 via a storage medium, the information transmitted via a communication line or the like may be stored in the storage portion 12, or the information input via an input device may be stored in the storage portion 12. In the storage portion 12, the information may be temporarily stored in a RAM or the like, or may be stored for a long period of time. The storage portion 12 can be realized as any storage medium (e.g., a semiconductor memory, a magnetic disk, an optical disk, etc.).

The calculating portion 13 calculates the rotational angle of the wafer 8 that is to be rotated by the alignment apparatus 2, the approach angle, which is an angle of a direction in which the transfer robot 3 for transferring the wafer 8 is to approach the wafer 8, and the distance between the wafer 8 after the rotation according to the rotational angle and the transfer robot 3, using the information stored in the storage portion 12 and the wafer center position and the wafer angle. Note that a specific calculating method will be described later. The phrase "direction in which the transfer robot 3 approaches the wafer 8" refers to the direction in which the transfer robot 3 moves a hand 3a when approaching the wafer 8.

Note that the rotational angle, the approach angle, and the distance calculated by the calculating portion 13 are as follows. That is to say, the rotational angle, the approach angle, and the distance are calculated such that, if the alignment apparatus 2 rotates the wafer 8 according to the calculated rotational angle, and the transfer robot 3 approaches the wafer 8 after the rotation, in a direction corresponding to the calculated approach angle, according to the calculated distance, the transfer robot 3 can retrieve the wafer 8 at the predetermined position and the predetermined angle from the alignment apparatus 2.

Figure 4C:
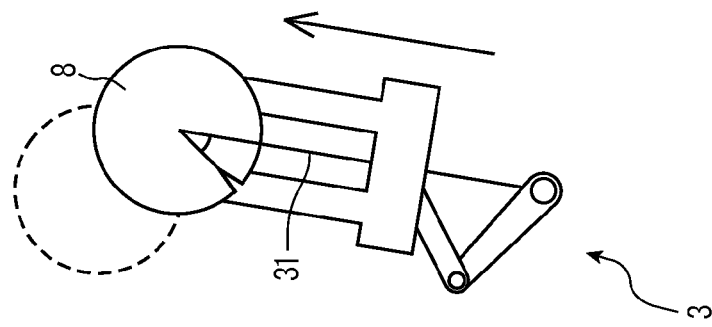
FIGS. 4A, 4B and 4C are views illustrating approach to a wafer in this example.

Next, the operations of the alignment apparatus 2 and the transfer robot 3 after the calculating apparatus 1 calculates the rotational angle and the like will be described with reference to FIGS. 4A to 4C. FIG. 4A is a view showing initial states of the alignment apparatus 2 and the transfer robot 3. In FIG. 4A, the wafer 8 indicated by the solid line is a wafer placed on the alignment apparatus 2. Furthermore, the wafer 8 indicated by the broken line is a wafer placed at the regular position and the regular angle on the alignment apparatus 2. Note that a straight line 31 indicates an approach direction in which the transfer robot 3 approaches the wafer 8.

Figure 4B:
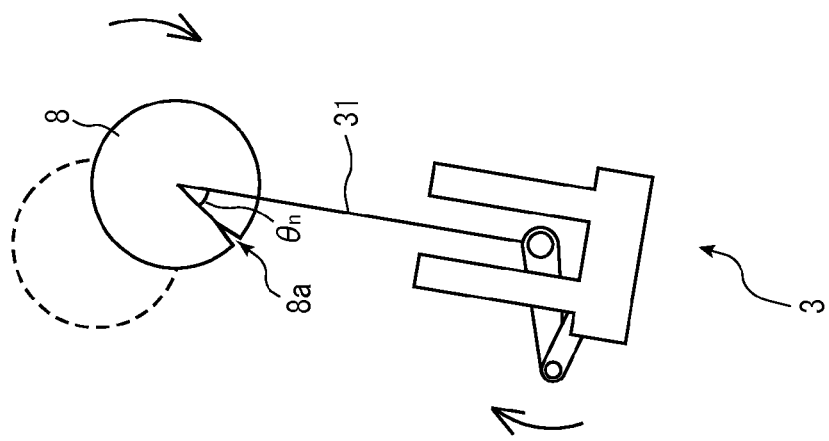
Figure 4A:
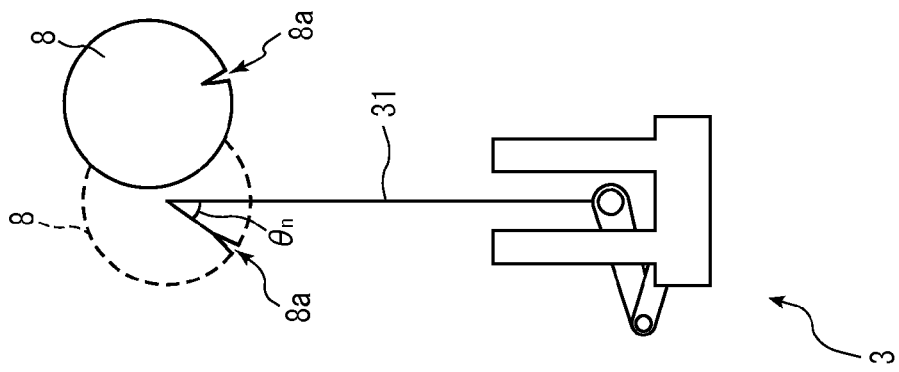

In FIG. 4B, the alignment apparatus 2 rotates the wafer 8 placed on the alignment apparatus 2, according to the rotational angle calculated by the calculating apparatus 1. As a result, the wafer 8 is rotated by the rotational angle. Furthermore, the transfer robot 3 approaches the wafer 8 after the rotation, in a direction corresponding to the approach angle calculated by the calculating apparatus 1. In order to allow the transfer robot 3 to approach the wafer 8 after the rotation, in a direction corresponding to the approach angle, it is possible to set the approach direction to the wafer 8 along the direction indicated by the approach angle, by turning the transfer robot 3 itself about its turning axis, for example, as shown in FIG. 4B, or by setting the movement direction of the hand 3a of the transfer robot 3 to the direction indicated by the approach angle. In the latter case, it is possible to change only the movement direction of the hand 3a in the manipulator, without turning the transfer robot 3 itself. Note that, in FIG. 4B, if the transfer robot 3 is turned according to the approach angle, the approach direction to the wafer 8 after the rotation is set along the direction indicated by the straight line 31. Furthermore, as shown in FIG. 4C, the transfer robot 3 approaches the wafer 8 after the rotation according to the calculated distance. The phrase "the transfer robot 3 approaches the wafer 8 after the rotation according to the calculated distance" refers to an operation in which the distance by which the transfer robot 3 moves the hand 3a so as to approach the wafer 8 is increased by L2-L1 compared with the case of approaching the wafer 8 at the regular position, where L1 is the distance between the wafer 8 at the regular position and the transfer robot 3, and L2 is the calculated distance. In this manner, if the wafer 8 is rotated by the rotational angle, and the transfer robot 3 approaches the wafer 8 after the rotation, in a direction corresponding to the approach angle calculated by the calculating apparatus 1, according to the distance calculated by the calculating apparatus 1, the transfer robot 3 can retrieve the wafer 8 at the predetermined position and the predetermined angle from the alignment apparatus 2. That is to say, the transfer robot 3 can retrieve the wafer 8 at the predetermined position and the predetermined angle, as in the case of retrieving the wafer 8 at the regular position and the regular angle.

Figure 5A:
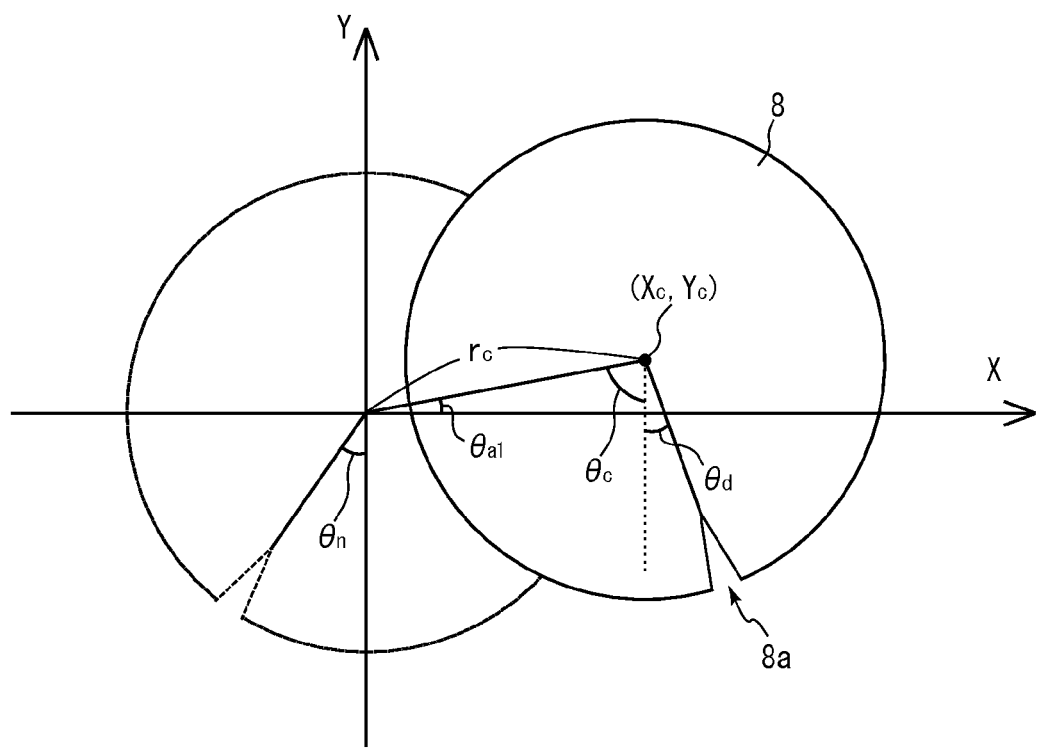
FIG. 5A is a view showing the angle and the like of a wafer before rotation in this example.
Figure 5B:
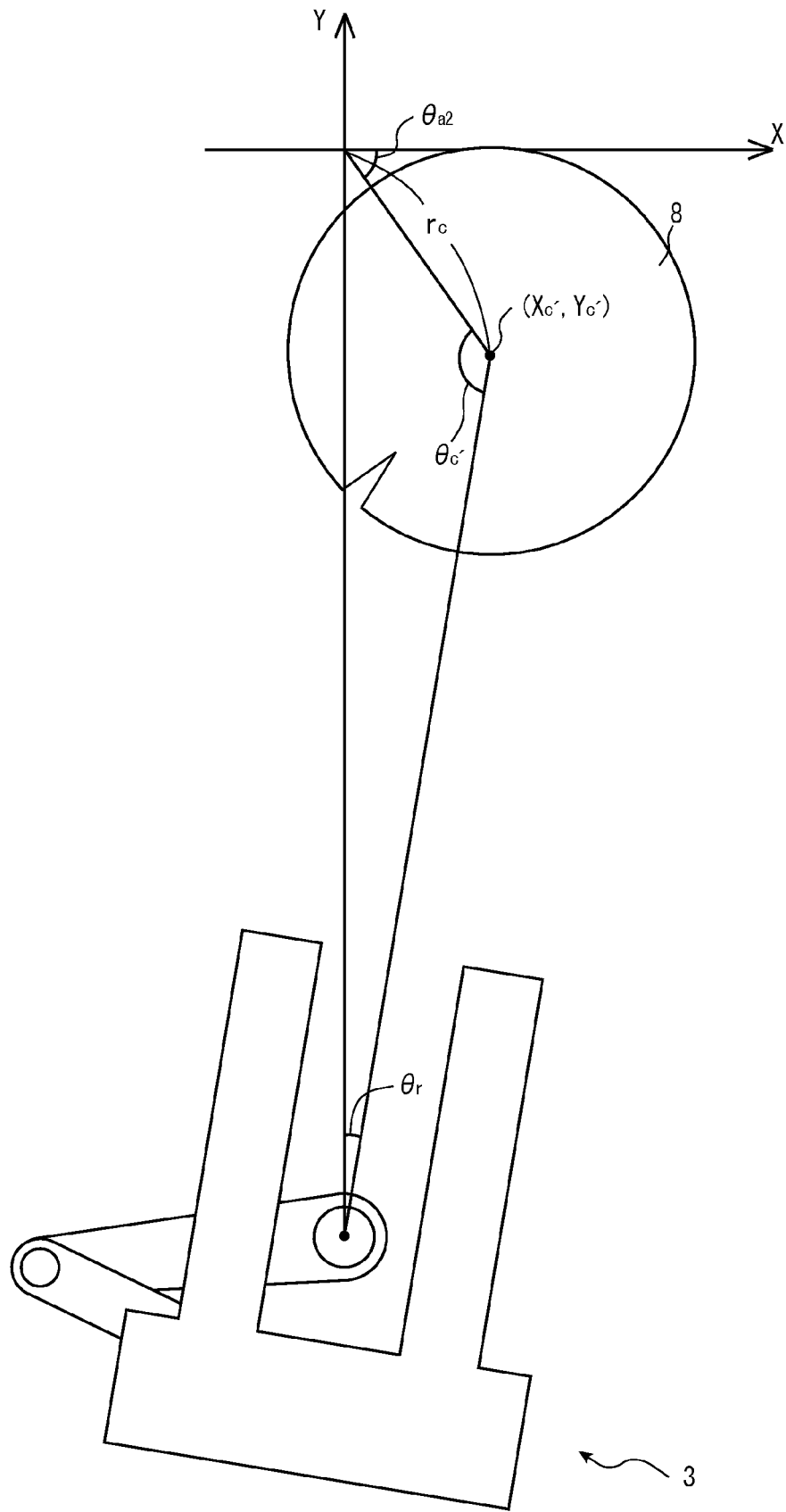
FIG. 5B is a view showing the angle and the like of a wafer after rotation in this example.

Hereinafter, a method of the calculating portion 13 for calculating the rotational angle and the like will be described. First, the definitions of angle, coordinate values, distance, and the like will be described. FIG. 5A is a view showing the position of the wafer 8 when the acquiring portion 11 acquires the wafer center position and the like. In FIG. 5A, the XY orthogonal coordinate system is set as described above. Furthermore, it is assumed that the coordinates of the center of the wafer 8 in the coordinate system are represented as ($X_c$, $Y_c$). In this example, it is assumed that the coordinates ($X_c$, $Y_c$) represent the wafer center position that is to be acquired by the acquiring portion 11. Furthermore, the distance from the origin to the wafer center position is taken as $r_c$. Furthermore, the angle from the line segment connecting the origin and the wafer center position to a straight line parallel to the Y axis is taken as $\theta_c$. Furthermore, the angle from the X axis to the line segment connecting the origin and the wafer center position is taken as $\theta_{a1}$. Furthermore, the angle from a straight line parallel to the Y axis to the line segment connecting the wafer center position and the position of the marker 8a is taken as $\theta_d$. In this example, it is assumed that the angle $\theta_d$ represents the wafer angle that is to be acquired by the acquiring portion 11. Furthermore, the angle from a straight line parallel to the Y axis to the line segment connecting the center position and the position of the marker 8a of the wafer 8 at the regular position and the regular angle indicated by the broken line is taken as $\theta_n$. The angle $\theta_n$ is a predetermined value, and is stored in the storage portion 12. FIG. 5B is a view showing the position of the wafer 8 after the rotation by the rotational angle calculated by the calculating portion 13. In FIGS. 5A and 5B, the origin is at the rotational center on the alignment apparatus 2, and, thus, the rotation according to the rotational angle is performed about the origin of the XY orthogonal coordinate system. Also in FIG. 5B, the XY orthogonal coordinate system is set as described above. Furthermore, it is assumed that the coordinates of the center of the wafer 8 after the rotation are represented as ($X_{c'}$, $Y_{c'}$). Furthermore, the angle from the line segment connecting the center position of the wafer 8 after the rotation and the origin to the line segment connecting the center position of the wafer 8 after the rotation and a reference position of the transfer robot 3 is taken as $\theta_{c'}$. In this example, it is assumed that the reference position of the transfer robot 3 is at the axial center at the proximal end of the manipulator of the transfer robot 3. Furthermore, the angle from the X axis to the line segment connecting the center position of the wafer 8 after the rotation and the origin is taken as $\theta_{a2}$. Furthermore, the distance from the center position of the wafer 8 after the rotation to the reference position of the transfer robot 3 is taken as $h_c$. In this example, it is assumed that the distance $h_c$ is the distance from the transfer robot 3 to the wafer 8 after the rotation, which is to be calculated by the calculating portion 13. Furthermore, it is assumed that the coordinates of the reference position of the transfer robot 3 are represented as (0, $h_r$). The value $h_r$ is a predetermined value, and is stored in the storage portion 12. Furthermore, the angle from the Y axis to the line segment connecting the center position of the wafer 8 after the rotation and the reference position of the transfer robot 3 is taken as $\theta_r$. The direction of that line segment is the direction in which the transfer robot 3 approaches the wafer 8 after the rotation, that is, the direction corresponding to the approach angle. In this example, it is assumed that the angle $\theta_r$ is the approach angle that is to be calculated by the calculating portion 13. Although not shown, the angle from the line segment connecting the center position of the wafer 8 before the rotation and the origin to the line segment connecting the center position of the wafer 8 after the rotation and the origin is taken as $\theta_a$. The angle $\theta_a$ is the rotational angle that is to be calculated by the calculating portion 13. Furthermore, if the transfer robot 3 can turn, the above-described reference position is preferably at the turning axis of the transfer robot 3. Furthermore, it is assumed that each of the angles is positive in the counter-clockwise direction, and is negative in the clockwise direction. That is to say, in the case as shown in FIGS. 5A and 5B, $\theta_n$, $\theta_{a2}$, $\theta_r$, and $\theta_a$ are negative, and the other angles are positive.

Figure 6:
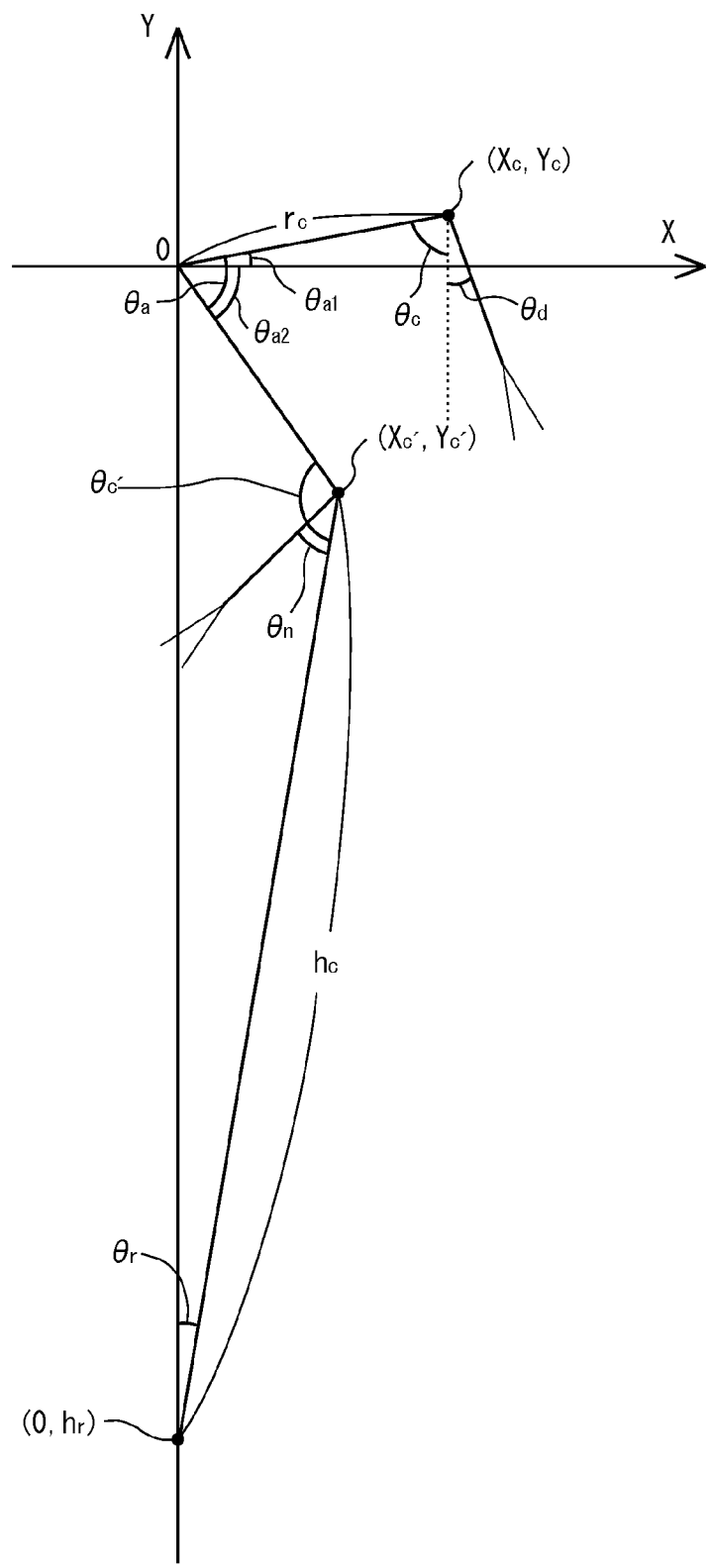
FIG. 6 is a graph showing angles, distances, and coordinates in this example.

FIG. 6 is a view showing the angles, the distances, and the coordinates in the XY orthogonal coordinate system described with reference to FIGS. 5A and 5B. If $X_c$, $Y_c$, and $\theta_d$ have been acquired by the acquiring portion 11, and $\theta_n$ and $h_r$ have been stored in the storage portion 12, the calculating portion 13 calculates the rotational angle $\theta_a$ of the wafer 8, the approach angle $\theta_r$, and the distance $h_c$ in the following manner. First, $\theta_c$, $\theta_{a1}$, and $r_c$ are as follows.

$$\theta_c = \arctan(X_c/Y_c)$$

$$\theta_{a1} = \arctan(Y_c/X_c)$$

$$r_c = \sqrt{X_c^2 + Y_c^2}$$

Furthermore, $\theta_{c'}$, can be represented by an equation using $\theta_c$, $\theta_n$, and $\theta_d$, and $\theta_c$ can be assigned to this equation as follows.

$$\theta_{c'} = \theta_c + \theta_d - \theta_n$$
$$= \arctan(X_c/Y_c) + \theta_d - \theta_n$$

Since $\theta_{40}$, $h_r$, and $r_c$ are known, a following equation is obtained using the law of cosines.

$$|h_r|^2 = h_c^2 + r_c^2 - 2h_c r_c \cos(\theta_{c'})$$

Since $h_c > 0$, $h_c$ can be represented as follows.

$$h_c = r_c \cos(\theta_{c'}) + \sqrt{|h_r|^2 - r_c^2 \sin^2(\theta_{c'})} \quad (1)$$
$$= \sqrt{X_c^2 + Y_c^2} \cos(\arctan(X_c/Y_c) + \theta_d - \theta_n) +$$
$$\sqrt{|h_r|^2 - (X_c^2 + Y_c^2)\sin^2(\arctan(X_c/Y_c) + \theta_d - \theta_n)}$$

Accordingly, the calculating portion 13 can calculate the distance $h_c$ between the wafer 8 after the rotation and the transfer robot 3, using the equation (1).

Furthermore, since $h_r$, $h_c$, and $r_c$ are known, $\theta_r$, can be obtained as follows using the law of cosines.

$$\theta_r = \arccos\left(\frac{|h_r|^2 + h_c^2 - r_c^2}{2|h_r|h_c}\right) \quad (2)$$

$$= \arccos\left(\frac{|h_r|^2 + h_c^2 - X_c^2 - Y_c^2}{2|h_r|h_c}\right)$$

Accordingly, the calculating portion 13 can calculate the approach angle $\theta_r$, which is an angle in which the transfer robot 3 approaches the wafer 8 after the rotation, by assigning $h_c$ calculated in the equation (1) to $h_c$ of the equation (2). As can be seen from the definitions of the angles, relationships between the range of $\theta_c$, and whether $\theta_r$ is positive or negative are as follows.

$$0° < \theta_c \le 180°: \theta_r < 0$$

$$180° < \theta_c \le 360°: \theta_r > 0$$

Next, $X_{c'}$ and $Y_{c'}$ can be obtained as follows using $h_r$, $h_c$, and $\theta_r$.

$$X_{c'} = -h_c \sin(\theta_r)$$

$$Y_{c'} = h_r + h_c \cos(\theta_r)$$

Accordingly, $\theta_{a2}$ can be obtained as follows using $X_{c'}$ and $Y_{c'}$.

$$\theta_{a2} = \arctan(Y_{c'}/X_{c'})$$

$$= \arctan\left(\frac{h_r + h_c \cos(\theta_r)}{-h_c \sin(\theta_r)}\right)$$

Furthermore, since $\theta_a = \theta_{a2} - \theta_{a1}$, $\theta_a$ can be obtained as follows.

$$\theta_a = \arctan\left(\frac{h_r + h_c \cos(\theta_r)}{-h_c \sin(\theta_r)}\right) - \arctan\left(\frac{Y_c}{X_c}\right) \quad (3)$$

Accordingly, the calculating portion 13 can calculate the rotational angle $\theta_a$, which is an angle in which the alignment apparatus 2 rotates the wafer 8, by assigning $h_c$ calculated in the equation (1) to $h_c$ of the equation (3) and assigning $\theta_r$ calculated in the equation (2) to $\theta_r$. Note that $\theta_a$ is set in a range of $-180° \le \theta_a \le 180°$ such that the rotational amount by which the alignment apparatus 2 rotates the wafer 8 is within 180°. Thus, if $\theta_a$ is not within this range, $\theta_a$ can be replaced as follows.

$$180° < \theta_a \le 360°: \theta_a \leftarrow \theta_a - 360°$$

$$-360° < \theta_a < -180°: \theta_a \leftarrow \theta_a + 360°$$

Note that the above-described calculating method is merely an example, and the calculating portion 13 may calculate the rotational angle, the approach angle, and the distance from the transfer robot 3 to the wafer 8 after the rotation, using methods other than the above-described method. Furthermore, the calculating portion 13 may store the values calculated using the equations (1) to (3), in a storage medium (not shown). Furthermore, the calculating portion 13 passes the calculated distance $h_c$ and approach angle $\theta_r$ to the transfer robot 3, and passes the calculated rotational angle $\theta_a$ to the alignment apparatus 2. Then, the alignment apparatus 2 rotates the wafer 8 by the rotational angle $\theta_a$, and the transfer robot 3 approaches the wafer 8 after the rotation, in a direction corresponding to the approach angle $\theta_r$, according to the distance $h_c$, so that the transfer robot 3 can retrieve the wafer 8 at the predetermined position and the predetermined angle. Note that, in this case, L1=$|h_r|$, and L2=$h_c$. Accordingly, the transfer robot 3 increases the approach length by $h_c-|h_r|$ compared with the case of approaching the wafer 8 placed at the regular position. If $h_c-|h_r|$ is negative, the transfer robot 3 decreases the approach length by the absolute value thereof.

Figure 7:
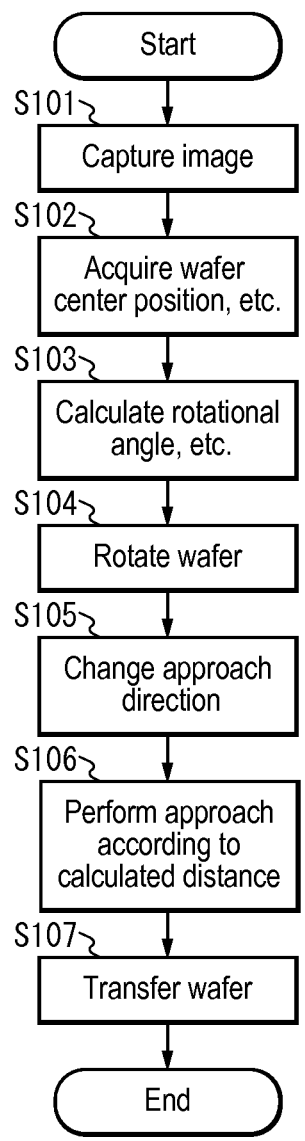
FIG. 7 is a flowchart showing an operation of the transfer robot system according to this example.

Next, an alignment operation in the transfer robot system 10 will be described with reference to the flowchart in FIG. 7.

(Step S101) The image capturing unit 21 captures an image of the wafer 8 placed on the alignment apparatus 2. Note that the captured image may be stored in a storage medium (not shown).

(Step S102) The acquiring unit 22 acquires the wafer center position and the wafer angle, using the captured image of the wafer 8. Note that the acquired wafer center position and the like may be stored in a storage medium (not shown).

(Step S103) The calculating portion 13 calculates the rotational angle, the approach angle, and the distance, from the equations (1) to (3), using the wafer center position and the wafer angle acquired by the acquiring portion 11 and the information stored in the storage portion 12. Note that the calculated rotational angle and the like may be stored in a storage medium (not shown).

(Step S104) The alignment apparatus 2 rotates the wafer 8 placed thereon, according to the rotational angle calculated by the calculating apparatus 1.

(Step S105) The transfer robot 3 changes the approach direction so as to move the hand 3a, in a direction corresponding to the approach angle calculated by the calculating apparatus 1. Specifically, the transfer robot 3 may be turned according to the approach angle, or may be set such that the movement direction of the hand 3a is along the approach angle.

(Step S106) The transfer robot 3 approaches the wafer 8 after the rotation, according to the distance calculated by the calculating apparatus 1, and retrieves the wafer 8 placed on the alignment apparatus 2.

(Step S107) The transfer robot 3 transfers the retrieved wafer 8 to the processing chambers 5 or the like. Note that the transfer robot 3 may transfer the wafer 8 that has been processed by the processing chambers 5 or the like, to the alignment apparatus 2 for alignment.

Note that, before the processing in step S101, processing may be performed in which the wafer 8 that is to be aligned is transferred to the alignment apparatus 2. Furthermore, in the case of acquiring the wafer center position and the like using the edge position, processing that detects the edge position and acquires the wafer center position and the like using the detected edge position may be performed instead of steps S101 and S102.

As described above, with the transfer robot system 10 according to this example, the rotational angle and the like are calculated by the calculating apparatus 1, the wafer 8 is rotated and the approach direction to the wafer 8 is set according to the calculated rotational angle and the like, so that the time necessary for the alignment can be shortened. That is to say, contrary to a conventional alignment method in which all processes are performed by the alignment apparatus alone, these processes are divided between the alignment apparatus 2 and the transfer robot 3, so that the time necessary for the alignment is shortened. Specifically, contrary to the conventional alignment method in which the alignment apparatus has to rotate the wafer 8 twice and has to move the wafer 8 once, it is sufficient in this example that the alignment apparatus 2 rotates the wafer 8 once, so that the time is shortened. Furthermore, if the acquiring portion 11 includes a single or multiple image capturing units 21 capable of capturing an image of the entire circumference of the wafer 8, it is possible to acquire the wafer center position and the wafer angle without rotating the wafer 8, thereby shortening the time necessary for acquiring the wafer center position and the like. As a result, the time necessary for the alignment can be shortened.

Note that, in this example, the calculating apparatus 1 may include an output portion (not shown) that passes the calculated rotational angle and the like to the alignment apparatus 2 or the transfer robot 3. The output portion may output the calculated rotational angle to the alignment apparatus 2, and output the calculated approach angle and distance to the transfer robot 3.

Furthermore, in the foregoing example, each processing or each function may be realized by integrated processing using a single apparatus or a single system, or alternatively, may be realized by distributed processing using multiple apparatuses or multiple systems. For example, calculation of the rotational angle and calculation of the approach angle and the distance may be performed by different apparatuses.

Furthermore, in the foregoing example, information transmission performed between constituent elements may be such that, for example, if two constituent elements for transmitting information are physically different from each other, the transmission is performed by one of the constituent elements outputting the information and the other constituent element accepting the information, or alternatively, if two constituent elements for transmitting information are substantially physically the same, the transmission is performed by shifting from a processing phase corresponding to one of the constituent elements to a processing phase corresponding to the other constituent element.

Furthermore, in the foregoing example, information relating to processing performed by each constituent element (e.g., information accepted, acquired, selected, generated, transmitted, or received by each constituent element, or information such as a threshold value, a numerical expression, or an address used by each constituent element in the processing) may be retained in a storage medium (not shown) temporarily or for a long period of time even if not specified in the description above. Furthermore, the information may be accumulated in the storage medium (not shown) by each constituent element or an accumulating portion (not shown). Furthermore, the information may be read from the storage medium (not shown) by each constituent element or a reading portion (not shown).

Furthermore, in the foregoing example, if information used by each constituent element or the like (e.g., information such as a threshold value, an address, or various setting values used by each constituent element in the processing) may be changed by a user, the user may change the information as appropriate even if not specified in the description above, but there is no limitation to this. If the user may change the information, the change may be realized by, for example, an accepting portion (not shown) that accepts a change instruction from the user and a changing portion (not shown) that changes the information according to the change instruction. The change instruction may be accepted by the accepting portion (not shown), for example, by accepting information from an input device, by receiving information transmitted via a communication line, or by accepting information read from a predetermined storage medium.

Furthermore, in the foregoing example, if two or more constituent elements included in the calculating apparatus 1 have a communication device, an input device, or the like, the two or more constituent elements may have a physically single device, or may have different devices.

Furthermore, in the foregoing example, each constituent element may be configured by dedicated hardware, or alternatively, constituent elements that can be realized as software may be realized by executing a program. For example, each constituent element may be realized by a program execution portion such as a CPU reading and executing a software program stored in a storage medium such as a hard disk or a semiconductor memory. At the time of executing the program, the program execution portion may execute the program while accessing the storage portion or the storage medium. Furthermore, this program may be executed by downloading from a server or the like, or may be executed by reading a program stored in a predetermined storage medium (e.g., an optical disk such as a CD-ROM, a magnetic disk, a semiconductor memory, etc.). Furthermore, the program may be used as a program forming a program product. Furthermore, a computer that executes the program may be a single computer or may be multiple computers. That is to say, integrated processing may be performed, or distributed processing may be performed.

Furthermore, it will be appreciated that the present invention is not limited to the example set forth herein, and various modifications are possible within the scope of the present invention.

As described above, the calculating apparatus and the like according to the present invention is effective in that the time necessary for the alignment can be shortened, and, thus, it is useful as an apparatus and the like for calculating the rotational angle and the like for alignment.

What is claimed is:

1. A calculating apparatus, comprising:
an acquiring portion that acquires a wafer center position, which is a center position of a wafer placed on an alignment apparatus and having a marker for angle acquisition, and a wafer angle, which is an angle corresponding to the marker; and
a calculating portion that calculates a rotational angle by which the wafer is to be rotated by the alignment apparatus, an approach angle, which is an angle of a direction in which a transfer robot for transferring the wafer is to approach the wafer, and a distance between the wafer after rotation according to the rotational angle and the transfer robot by using the wafer center position and the wafer angle, wherein
the transfer robot retrieves the wafer at a predetermined position and a predetermined angle from the alignment apparatus, by approaching the wafer after rotation in a direction corresponding to the approach angle and according to the distance,
the acquiring portion comprises:
an image capturing unit that captures an image of the wafer placed on the alignment apparatus; and
an acquiring unit that acquires the wafer center position and the wafer angle of the wafer by using an image of the wafer captured by the image capturing unit,
the acquiring portion has two or more image capturing units that capture images of different areas of the wafer placed on the alignment apparatus, and
the acquiring unit acquires the wafer center position and the wafer angle by using at least one image including the marker among two or more images of the wafer captured by the two or more image capturing units.

2. A transfer robot system, comprising:
a calculating apparatus;
an alignment apparatus; and a transfer robot, wherein
the calculating apparatus includes:
- an acquiring portion that acquires a wafer center position, which is a center position of a wafer placed on the alignment apparatus and having a marker for angle acquisition, and a wafer angle, which is an angle corresponding to the marker; and
- a calculating portion that calculates a rotational angle by which the wafer is to be rotated by the alignment apparatus, an approach angle, which is an angle of a direction in which the transfer robot for transferring the wafer is to approach the wafer, and a distance between the wafer after rotation according to the rotational angle and the transfer robot by using the wafer center position and the wafer angle, the transfer robot retrieves the wafer at a predetermined position and a predetermined angle from the alignment apparatus, by approaching the wafer after rotation in the direction corresponding to the approach angle and according to the distance, the alignment apparatus that rotates the wafer according to the rotational angle calculated by the calculating apparatus, and the transfer robot that approaches the wafer after rotation in a direction corresponding to the approach angle calculated by the calculating apparatus and according to the distance calculated by the calculating apparatus.

3. The transfer robot system according to claim 2, wherein the acquiring portion comprises:
- an image capturing unit that captures an image of the wafer placed on the alignment apparatus; and
- an acquiring unit that acquires the wafer center position and the wafer angle of the wafer by using an image of the wafer captured by the image capturing unit.

4. The transfer robot system according to claim 3, wherein the image capturing unit has an optical axis that is not along a normal direction of the wafer.

* * * * *